US006653862B2

(12) United States Patent
Johnson et al.

(10) Patent No.: US 6,653,862 B2
(45) Date of Patent: Nov. 25, 2003

(54) USE OF DANGLING PARTIAL LINES FOR INTERFACING IN A PLD

(75) Inventors: Brian D. Johnson, Sunnyvale, CA (US); Andy L. Lee, San Jose, CA (US); Cameron McClintock, Mountain View, CA (US); Giles V. Powell, Alameda, CA (US); Paul Leventis, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/140,911

(22) Filed: May 6, 2002

(65) Prior Publication Data

US 2002/0163358 A1 Nov. 7, 2002

Related U.S. Application Data

(60) Provisional application No. 60/289,346, filed on May 6, 2001.

(51) Int. Cl.[7] .................... H03K 19/177; G06F 17/50
(52) U.S. Cl. ..................... 326/41; 326/47; 716/14
(58) Field of Search ................. 326/41, 37–39, 326/47, 101; 716/12–14

(56) References Cited

U.S. PATENT DOCUMENTS

| | | | |
|---|---|---|---|
| 4,870,302 A | 9/1989 | Freeman | |
| 4,871,930 A | 10/1989 | Wong et al. | |
| 5,121,006 A | 6/1992 | Pedersen | |
| 5,241,224 A | 8/1993 | Pedersen et al. | |
| 5,243,238 A | 9/1993 | Kean | |
| 5,260,611 A | 11/1993 | Cliff et al. | |
| 5,359,536 A | * 10/1994 | Agrawal et al. | 716/16 |
| 5,455,525 A | 10/1995 | Ho et al. | |
| 5,485,103 A | 1/1996 | Pedersen et al. | |
| 5,537,057 A | 7/1996 | Leong et al. | |
| 5,541,530 A | 7/1996 | Cliff et al. | |
| 5,550,782 A | 8/1996 | Cliff et al. | |

(List continued on next page.)

OTHER PUBLICATIONS

Altera Corporation (Jun. 1996). "Max 7000: Programmable logic device family" *Data Book, A–DB–0696–01*, version 4, pp. 193–261.

Altera Corporation (Oct. 2001). Excalibur "Description of the The Floor plan", pp. 1–1 through 1–10.

Betz, V. et al., eds. (1999) "Background and Previous Work," Chapter 2 In *Architecture and CAD for Deep–Submicron FPGAs*, Kluwer Academic, Boston pp. 12–18.

Betz, V. et al., eds. (1999). "Routing Tools and Routing Architecture Generation,"Chapter 4 In *Architecture and CAD for Deep–Submicron FPGAs*, Kluwer Academic, Boston, pp. 63–95.

Betz, V. et al., eds. (1999). "Detailed Routing Architecture," Chapter 7 In *Architecture and CAD for Deep–Submicron FPGAs*, Kluwer Academic, Boston, pp. 151–190.

Betz, V. et al., eds. (1999). "Global Routing Architecture," Chapter 5 In *Architecture and CAD for Deep–Submicron FPGAs*, Kluwer Academic, Boston, pp. 105–126.

Xilinx. (Nov. 2000). "Programmable Logic: News and Views, a montly report on developments in the PLD/FPGA industry" *Electronic Trend Publications, Inc.*, IX(11):14–15. (Includes Table of Contents).

Xilinx. (Oct. 2000) "Putting It All the Together. The Vitrex–II Series Platform FPGA: World fastest logic and routing" Xilinx brochure, p. 83.

Primary Examiner—James H. Cho
(74) Attorney, Agent, or Firm—Morrison & Foerster LLP

(57) ABSTRACT

A routing structure in a PLD is implemented in a staggered fashion. Routing lines that would otherwise be "partial" and dangling at a routing architecture boundary are driven, providing additional flexibility for routing signals to the PLD core from the boundaries.

22 Claims, 7 Drawing Sheets

U.S. PATENT DOCUMENTS

| | | |
|---|---|---|
| 5,557,217 A | 9/1996 | Pedersen |
| 5,581,199 A | 12/1996 | Pierce et al. |
| 5,592,106 A | 1/1997 | Leong et al. |
| 5,682,107 A | 10/1997 | Tavana et al. |
| 5,689,195 A | 11/1997 | Cliff et al. |
| 5,701,091 A | 12/1997 | Kean |
| 5,705,939 A | 1/1998 | McClintock et al. |
| 5,760,604 A | 6/1998 | Pierce et al. |
| 5,847,579 A | 12/1998 | Trimberger |
| 5,880,598 A | 3/1999 | Duong |
| 5,903,165 A | 5/1999 | Jones et al. |
| 5,907,248 A | 5/1999 | Bauer et al. |
| 5,909,126 A | 6/1999 | Cliff et al. |
| 5,914,616 A | 6/1999 | Young et al. |
| 5,942,913 A | 8/1999 | Young et al. |
| 5,977,793 A | 11/1999 | Reddy et al. |
| 6,002,268 A * | 12/1999 | Sasaki et al. .............. 326/41 |
| 6,084,429 A | 7/2000 | Trimberger |
| 6,107,824 A | 8/2000 | Reddy et al. |
| 6,204,690 B1 | 3/2001 | Young et al. |
| 6,218,859 B1 | 4/2001 | Pedersen |
| 6,278,291 B1 | 8/2001 | McClintock et al. |
| 6,292,018 B1 | 9/2001 | Kean |
| 6,300,794 B1 | 10/2001 | Reddy et al. |
| 2001/0033188 A1 | 10/2001 | Aung et al. |

\* cited by examiner

Fig. 7.

|  | Horizontal MegaRAM Interface | | Vertical MegaRAM Interface | |
| --- | --- | --- | --- | --- |
|  | Ways in per line | Connections per MRAM_LIM | Ways in per line | Connections per MRAM_LIM |
| H4 | 3 | 8 | 0 | 0 |
| H8 | 3 or 4 | 2 or 3 | 0 | 0 |
| H24 | 0 | 0 | 0 | 0 |
| V4 | 1 or 2 | 4 | 4 or 5 | 12 |
| V8 | 1 or 2 | 1 or 2 | 3 or 4 | 4 |
| V16 | 0 | 0 | 0 | 0 |
| Sneak path from adjacent LAB | 1 | 0 or 1 | 0 | 0 |
| Total MRAM LIM fanin |  | 16 |  | 16 |
| Total number MRAM LIM muxes | 30 | | 30 | |

Fig. 8.

|  | Mega-RAM Horizontal Interface | Mega-RAM Vertical Interface |
| --- | --- | --- |
| H4 DIM | 9 or 10 | N/A |
| H8 DIM | 1, 2 or 3 | N/A |
| H24 DIM | 0 | N/A |
| V4 DIM | 5 | 5 |
| V8 DIM | 2 or 3 | 1 |
| V16 DIM | 0 | N/A |
| Total ways out per MegaRAM Out | 17 to 21 | 6 |

Fig. 9.

|  | Mega-RAM Horizontal Interface | Mega-RAM Vertical Interface |
| --- | --- | --- |
| Lablines | 30 | 30 |
| MRIMs | 24 | 24 |
| H4 Drivers | 20 | 0 |
| H8 Drivers | 3 | 0 |
| H24 Drivers | 0 or 1 | 0 |
| V4 Drivers | 10 + 10 redundant | 20 |
| V8 Drivers | 2 + 2 redundant | 4 |
| V16 Drivers | 0 or 1 + 0 or 1 redundant | 0 |

US 6,653,862 B2

USE OF DANGLING PARTIAL LINES FOR INTERFACING IN A PLD

CROSS-REFERENCE TO RELATED APPLICATIONS

This application claims the benefit of U.S. Provisional Application Serial No. 60/289,346, filed May 6, 2001, and entitled "Use of Dangling Partial lines for Interfacing in a PLD."

TECHNICAL FIELD

The present invention is in the field of programmable logic devices (PLD's) and, more particularly, relates to PLD's having an array of logic elements with a staggered routing architecture such that partial lines result and such partial lines that would otherwise be dangling at interfaces are driven to provide additional signal path flexibility.

BACKGROUND

Conventional programmable logic devices (PLD's) comprise an array of logic elements (LE's), and the routing architecture provides a signal path between LE's. It is desired to increase the flexibility by which signals can be driven between the PLD core and boundaries of the routing architecture.

SUMMARY

In accordance with a broad aspect of the invention, a routing structure in a PLD is implemented in a staggered fashion. Routing lines which would otherwise be "partial" and dangling at a routing architecture boundary are driven, providing additional flexibility for routing signals to the PLD core from the boundaries.

BRIEF DESCRIPTION OF FIGURES

FIG. 7 is a table illustrating connectivity details of the MRAM_LIM

FIG. 8 is a table illustrating the Mega_RAM Out signal connections.

FIG. 9 is a table illustrating the Mega-RAM interface specifications.

DETAILED DESCRIPTION

Figure 1:
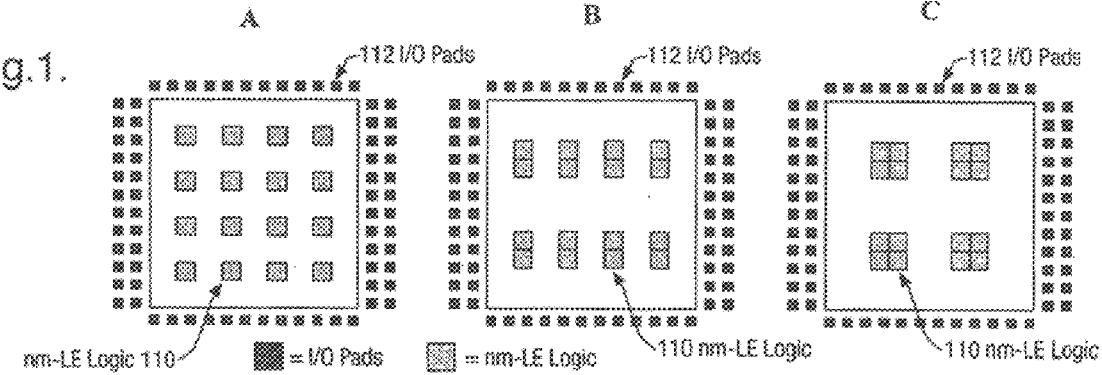
FIGS. 1A, 1B and 1C illustrate possible placements of "big" IP function blocks within a PLD and not adjacent to an edge of the LE array, for a "big" IP function block such as a memory for which direct I/O access is not a requirement.

FIGS. 1A, 1B and 1C and 2A, 2B and 2C illustrate possible floorplans for a PLD architecture in accordance with an aspect of the invention. The illustrations in FIGS. 1A, 1B and 1C are examples only, and the invention is not limited to the examples shown in FIGS. 1A, 1B and 1C. In accordance with the invention, a method of creating the floorplans of FIGS. 1A, 1B and 1C (and other floorplans within the scope of the invention) is now described.

The base signal routing architecture is defined and optimized for LE's. For example, an array of LE's is created for a particular target die size. For variants of the created LE array, as discussed in the Background, it is desired to place the IP function block within the LE array. In some embodiments, the IP function block is added as IP function blocks at some desired uniform density, although the density of IP function blocks need not be uniform. For IP function blocks added to the LE array, LE's are replaced. Thus, there is a tradeoff between LE's and the amount of IP added to the die. The array of LE's for which a particular base signal routing architecture is optimized may occupy substantially an entire target die. Alternately, a base signal routing architecture may be optimized for an array of LE's that coexists on a die with other circuitry, including other LE's.

Figure 2:
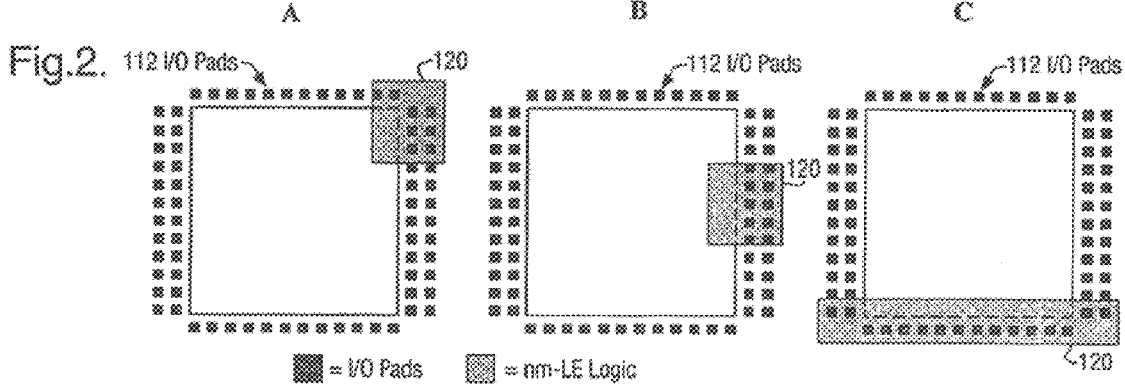
FIGS. 2A, 2B and 2C illustrate possible placements of big IP function blocks within a PLD and adjacent to an edge of the LE array such that direct I/O access is provided.

FIGS. 1A, 1B and 1C illustrate IP function block 110 incorporated within the interior of an LE array, for an IP function block that does not require direct I/O pad 112 access. FIGS. 2A and 2B illustrate an IP function block 120 incorporated at the edge of the LE array but not spanning the entire edge of the LE array, such that I/O pad 112 access is provided to the IP function block 120. Furthermore, while not shown in FIGS. 2A and 2B, the IP function block can even displace I/O pads 112, if desired.

Figure 3:
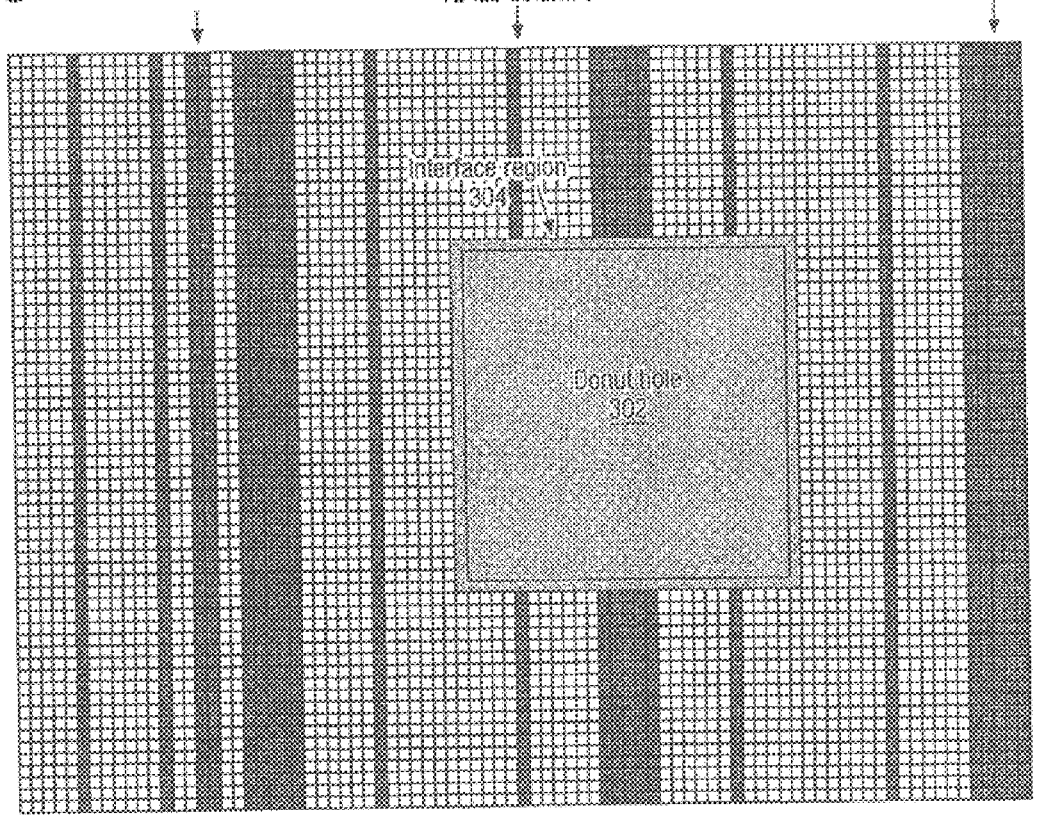
FIG. 3 illustrates a "donut hole" within the context of a PLD, for placement of a "big" IP function block within a PLD and not adjacent to an edge of the LE array.

FIG. 3 illustrates how an IP function block is incorporated as a "donut hole" 302 as applied to the FIGS. 1A, 1B and 1C examples. That is, within the region where the IP function block is incorporated, the base signal routing architecture is interrupted, and a hole 302 is left (at least in one layer of the metal) for the IP function block to be incorporated. In addition, an interface region 304 is provided completely surrounding the hole 302 for interfacing the remaining base signal array routing to the IP function block. A very specific example of one such interface block is described later with reference to FIGS. 5 and 6. It should be noted that some of the lines of the base signal routing architecture may be routed around the hole 302 by being raised from the interface region 304 at one side of the hole 302 to a different layer of the metal not occupied by the hole 302 and lowered back into the interface region 304 at another side of the hole 302, typically the opposite side of the hole 302. To generalize, signal routing lines for driving shorter distances are terminated, and routing lines for driving longer distances are raised to a different layer of metal, buffered across the hole, and lowered into the interface region at the opposite side of the donut hole. What is "shorter" and "longer" is variable for any particular embodiment and is discussed later with respect to the size of the interruption—"small" or "large." Typically, those routing lines buffered across a hole do so without being connected to the IP function block in the hole region.

An interface region is provided even when the IP function block is not to be bordered on all four sides by the base signal routing architecture as illustrated in the FIG. 3 embodiment but, rather, is to be bordered on two sides (an example of which is shown in FIG. 2A), three sides (an example of which is shown in FIG. 2B), or even one side (an example of which is shown in FIG. 2C). The interface region is typically provided on each side of the hole that borders the base signal routing architecture.

Figure 4:
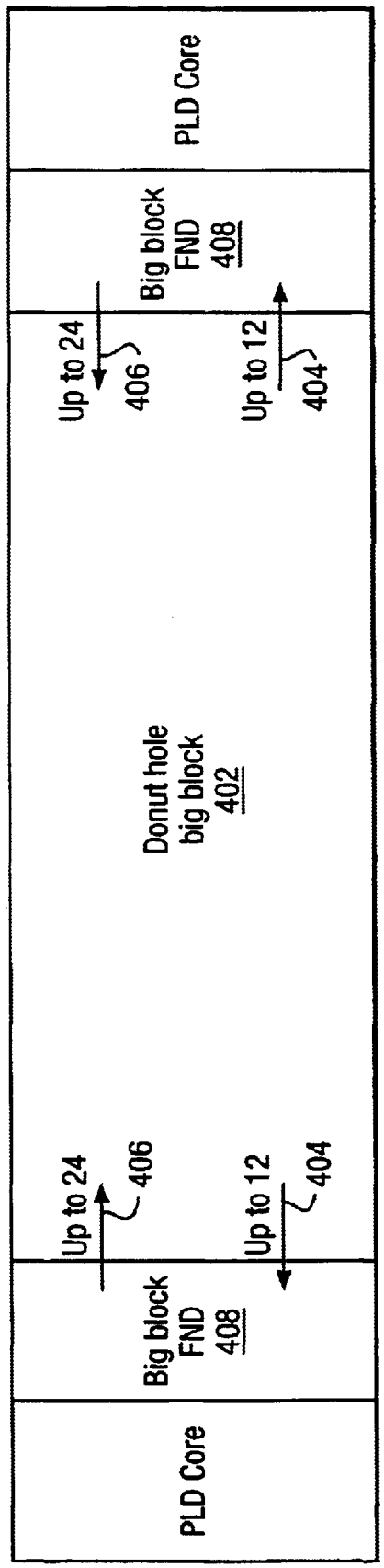
FIG. 4 illustrates, in greater detail, a "big block" interface region as used in FIGS. 1, 2 and 3.

FIG. 4 illustrates an embodiment of the interface region 304. That is, in accordance with the FIG. 4, it is shown that, for some level of granularity, the interface region 408 includes up to 24 signal lines into the hole 402 and up to 12 signal lines out of the hole 402. The interface region 408 is built modularly, at a particular level of granularity. In one embodiment, the particular level of granularity is one width or height of the logic array block (LAB) of the LE array.

A design consideration for the placement of a hole is the number of signal lines in and out of a hole that would result from a particular placement, primarily as a result of the extent to which the hole would border the base signal routing architecture. This can be seen with reference again to FIGS. 2A and 2B.

Figure 5:
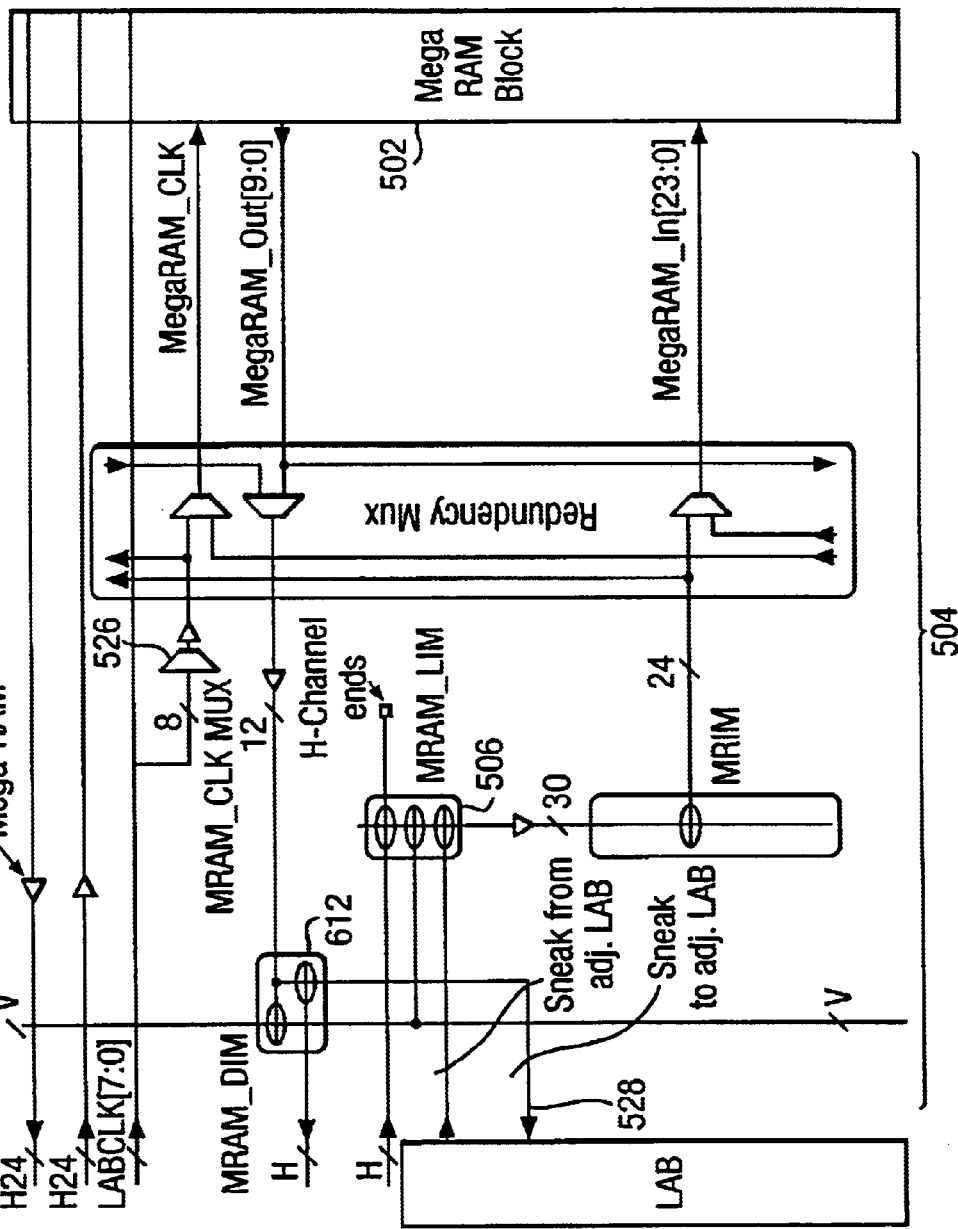
FIG. 5 illustrates the horizontal interface to a "big block" that is a large random access memory ("MRAM").
Figure 6:
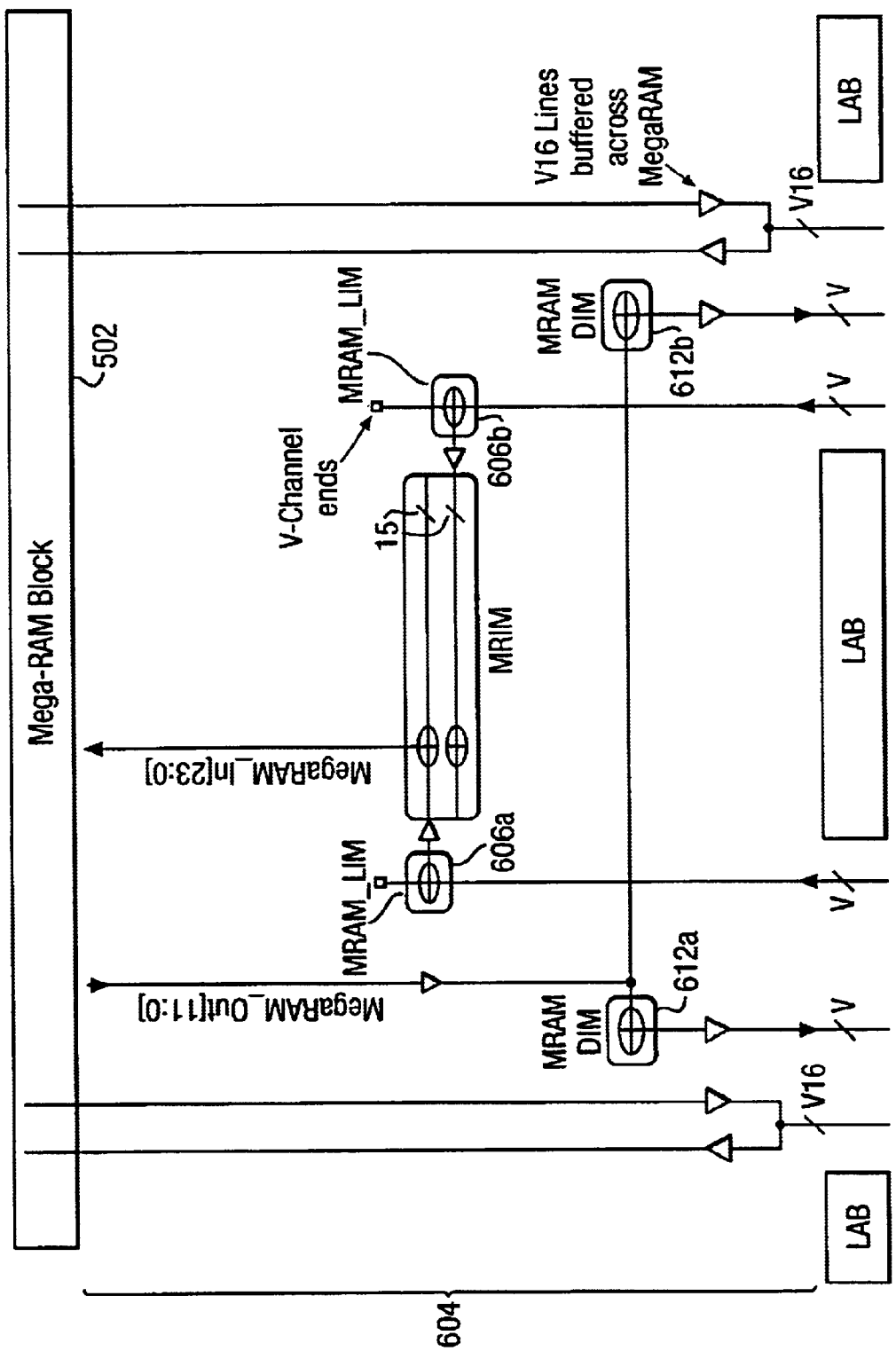
FIG. 6 illustrates the vertical interface to the MRAM.

FIGS. 5 and 6 illustrate a situation where the IP function block is a RAM block C designated in FIGS. 5 and 6 as a "Mega-Ram" 502). FIG. 5 illustrates the situation from the horizontal routing perspective, and FIG. 6 illustrates the situation from the vertical routing perspective. The Mega-RAM block 502 spans multiple columns and multiple rows of the LE array, and therefore interfaces with many lines ("channels") of routing. The general routing does not cross the Mega-RAM 502. Rather, the general routing "dead ends" at the Mega-RAM Interface (a specific instance of the FIG. 3 interface region) to form the donut hole for the Mega-RAM. The H24 (FIG. 5) and V16 (FIG. 6) routing lines are buffered across the Mega-RAM block. The Mega-RAM horizontal interface 504 (FIG. 5) allows the Mega-RAM to interface to logic to the left or to the right of the Mega-RAM. The Mega-RAM vertical interface 604 (FIG. 6) allows the Mega-RAM to interface to logic above and below the Mega-RAM. In the Mega-RAM vertical interface (FIG. 6), there are two groups of fifteen MRAM_LIM's (Not all are shown). Each of the two groups is fed by a different V-Channel. One Mega-RAM interface is provided on each of the left and right hand edges of the MegaRAM for every LAB row it spans, and one Mega-RAM interface is provided on each of the top and bottom edges of the Mega-Ram for every pair of LAB columns it spans.

Driving into the Mega-RAM 502 is now described. H and V routing lines in a typical embodiment connect into MRAM_LIM's 506, 606a and 606b (LAB input multiplexers). The MRAM$_{13}$ LIM 506, 606a and 606b is a two stage 4-way sharing multiplexer. Of the portion of the routing that terminates at the boundaries of the Mega-RAM 502, only the routing able to carry signals toward the Mega-RAM 502 feeds the MRAM_LIM's 506, 606a and 606b. Therefore, if the routing is unidirectional (i.e., each line can carry a signal in one direction), then routing able to carry signals away from the MRAM will not be coupled to the input interface. In another embodiment, bi-directional lines are used in addition to, or in place of, unidirectional lines.

Connectivity details of the MRAM_LIM 506, 606a and 606b are listed in the table of FIG. 7. Briefly, FIG. 7 lists the number of "ways in per line" and the number of "connections per MRAM_LIM" for each of the Horizontal Mega-RAM interface (FIG. 5) and the Vertical MegaRAM interface (FIG. 6). At the bottom of the FIG. 7 table, the listed totals include the total number of MRAM_LIM fan in signals, and the total number of MRAM_LIM multiplexers, for each of the Horizontal MegaRAM interface and the Vertical MegaRAM interface.

Clock inputs 524 are taken into the Mega-RAM block 502 from the global clock network at the side of the Mega-RAM block 502 through the Mega-RAM horizontal interface 504 in (FIG. 5). The MRAM_CLOCK MUX 526 chooses one of the eight LABCLK's that are feeding through the adjacent LABs. There is one clock input to the Mega-RAM 502 per row, although the Mega-RAM 502 typically would not use every clock input available to it.

The Mega-RAM input mux ("MRIM") is a fully populated 4-way mux-sharing that connects thirty LAB lines onto twenty-four I/O block inputs.

Driving out of the Mega-RAM 502 is now described. At the edge of the Mega-RAM, routing lines driving into the core do not have LAB's to drive them and are left as partial length lines. The Mega-RAM interface uses the full-length and partial length (i.e., length four and length eight lines, in this embodiment) to connect to the core via the MRAM_DIM. The Mega-RAM interface provides similar resources as are provided for a LAB to drive onto the core routing. For example, H4 lines extending four LAB's into the core are driven, and H4 lines extending three LAB's in or less are not driven. These partial length lines are driven to Vcc. In another embodiment, the partial length lines connect to the MRAM_LIM's as described below with reference to FIG. 10.

The Mega-RAM horizontal interface can also drive signals out onto the adjacent V-channel routing. Ten partial length sneak paths (H4, H8, V16, H24) (e.g., as collectively designated by line 528) are driven directly into adjacent LAB's by ten of the twelve MegaRAM_Out signals for a "quick" path to logic.

Each MRAM driver input multiplexer ("MRAM DIM") 612a, 612b supports the V-channel at the edge of the core and the half H-channel able to carry signals from the MRAM in the direction of the core. The Mega-RAM vertical interface 604 drives the full-length routing resources of two full V-channels. These drivers are dedicated to the MegaRAM_Out signals and do not support turns from other routing resources. The DIM's 612a and 612b associated with the V-line drivers in the Mega-RAM vertical interface 604 are used to choose between MegaRAM_Out signals. Each DIM 612a, 612b in the vertical interface is a 4:1 mux that can be implemented in one or more stages, and each input to the DIM is a MegaRAM_Out signal. The connection pattern from the MegaRAM_Out signals to the DIM 612a, 612b is typically spread equally between the two V-channels.

The number of MegaRAM_Out signal connections per DIM for each of the Mega_RAM Horizontal Interface (FIG. 5) and the Mega_RAM Vertical Interface (FIG. 6) are set forth in FIG. 8. FIG. 9 is a summary of the Mega_RAM interface specifications for each of the Mega_RAM Horizontal Interface and the Mega_RAM Vertical Interface, and lists the total number of the various interface components described above.

It is noted that, typically, not all IP function blocks need be incorporated into an LE array using the hole concept. For example, the IP function block may be of two types—small and large. In general, the terms small and large as used here can be thought of as indicating size. One actual design consideration, however, in determining whether to consider particular IP function block as small or large is a consideration of how much disruption to the timing of signal routing is to be tolerated. For example, in accordance with one embodiment, a small block is an IP function block whose layout can be drawn at a width on the order of an LE width. In accordance with this embodiment, the width of small blocks may be wider than an LE so long as the timing of signal routing over the block does not get significantly larger than for routing over an LE. For example, in one 0.13 µm architecture, it has been deemed that the timing of the signal routing over a block of roughly 5 LE widths does not get significantly larger than for routing over an LE. Typically, additional inputs and/or outputs may be added that exceed the width of an LE, so long as the base signal routing architecture across the IP function block is maintained with the LE's surrounding the small block. Another consideration for determining whether an IP function block is large (implemented using the hole concept) or small is the size of the IP function block relative to the overhead associated with employing an interface region. In one embodiment, small blocks include MEAB's (medium sized embedded array blocks), SEAB's (small sized embedded array blocks) and a DSP block. By contrast, large blocks are IP function blocks that typically have dimensions much larger than that of an LE. Extending the base signal routing architecture across these blocks without modification would cause routing over these blocks to be significantly larger than routing over an LE, forming a boundary in the PLD timing model. Such large blocks may be inserted into the LE array as holes in the base signal routing architecture, as described above. In some sense, what occurs at the boundary between the base signal routing architecture and a hole is similar to the base signal routing architecture ending at the edge of an LE array.

Figure 10:
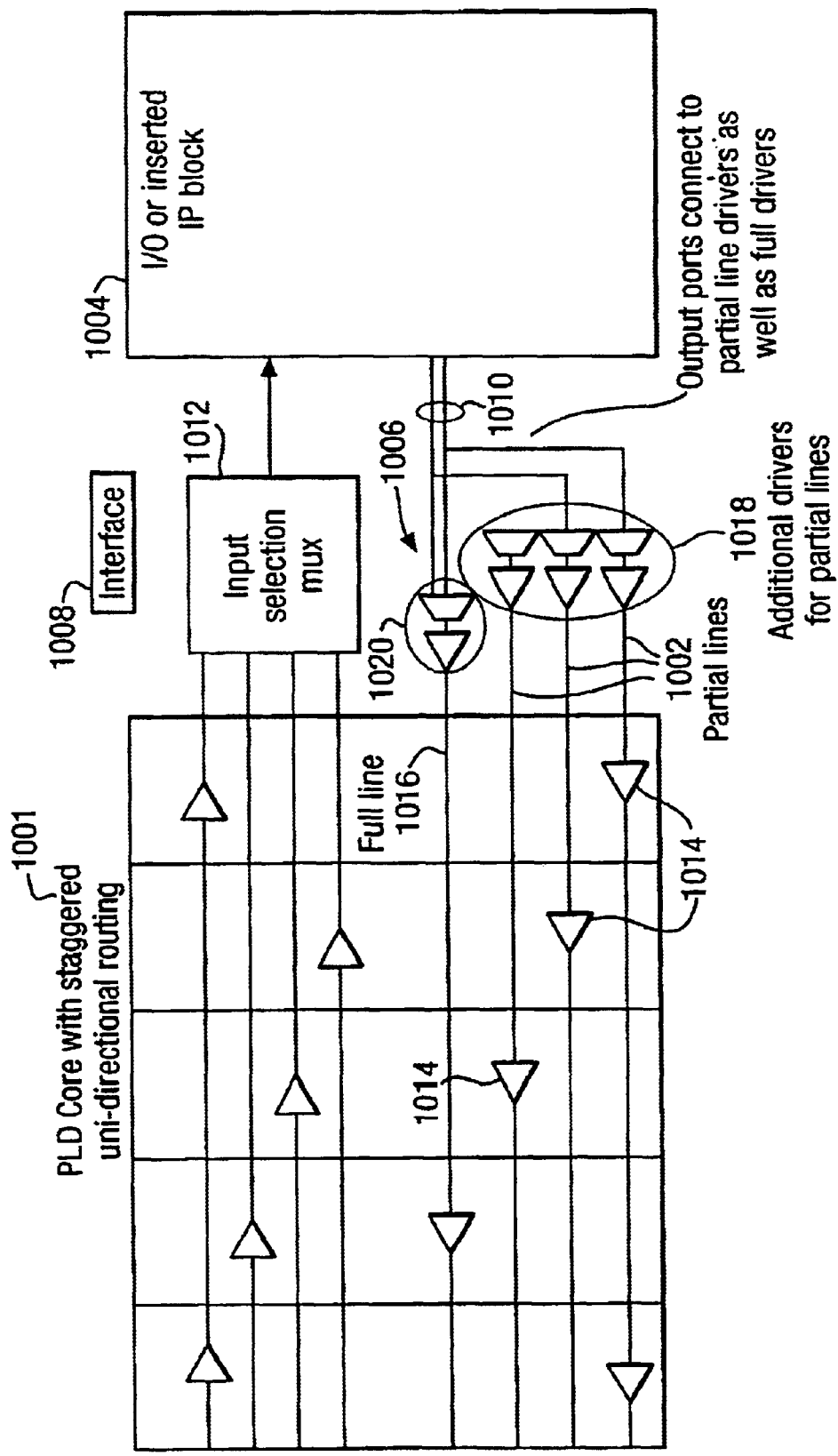
FIG. 10 illustrates an embodiment of a staggered routing architecture, in which the partial lines at the boundary of the staggered routing architecture are driven.

In some embodiments, shown with reference to FIG. 10, the LE routing lines are part of a staggered, unidirectional routing architecture. As a result of the staggering, as can be seen from FIG. 10, there are partial lines 1002 at boundaries formed by, for example, the I/O interface 1008 at the edge of the PLD 1001 or by an inserted IP function block (designated by reference numeral 1004). In accordance with some such staggered architecture embodiments, routing drivers 1006 are included in the interface region 1008 (whether the I/O interface region or the hole interface region) to drive both the full and partial lines. The output ports 1010 of the logic block 1004 connect to the drivers of both the "full" lines and the "partial" lines.

Signal selection muxes may be used in front of the drivers to add routing flexibility. The connection may include a programmable connection such as static random-access memory, dynamic random-access memory, electrically erasable programmable read-only memory, flash, fuse, and anti-fuse programmable connections. The connection could also be implemented through mask programming during the fabrication of the device. As described above, the routing may also be implemented with segmented bi-directional lines.

The partial lines 1002 driving out of the PLD core 1001 feed an input selection mux 1012 to drive into the logic block 1004. These partial lines 1002 impose a smaller load on the drivers 1014 than do full lines 1016, and having a small load makes the partial line 1002 a faster path into the PLD core 1001. If area is a concern, drivers 1018 for partial lines 1002 may be smaller than drivers 1020 for full lines 1016, and still not be at a speed disadvantage due to the smaller load.

Furthermore, by driving even the partial lines 1002, additional routing flexibility is provided for signals from the PLD core 1001 to the PLD boundaries. Allowing the partial lines 1002 headed out of the PLD 1001 to drive into an IP function block 1004 increases the routability from the PLD core 1001 to the logic block 1004. In addition, the additional drivers 1018 may be used to provide the core 1001 access to more signals, or the signals may be used to provide more paths into the PLD core 1001 for a given signal. Thus, quite simply, lines that would have otherwise been unused are utilized to provide needed access to the PLD core 1001.

While the present invention has been particularly described with respect to the illustrated embodiments, it will be appreciated that various alterations, modifications and adaptations may be based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the claims. For example, the techniques described herein may be applied to other types of fixed blocks or routing structures.

What is claimed is:

1. A programmable logic device (PLD), comprising:
a plurality of logic elements (LE's) arranged in an array;
a signal routing architecture including a plurality of signal routing lines to route signals among the LE's; and
a plurality of signal drivers along each of the signal routing lines,
wherein
for each of the signal routing lines,
that signal routing line has an integer N associated with the signal routing line;
the drivers along that signal routing line are regularly spaced along that signal routing line at an interval of N LE's for that line;
for each of a first set of at least some of the signal routing lines,
that signal routing line is substantially interrupted by an interface region such that a partial signal routing line is formed for that signal routing line between the interface region and a driver along the signal routing line from the interface region less than N LE's from the interface region; and
the PLD further comprises an input driver configured to drive from the interface region along the partial signal routing line formed for that signal routing line.

2. The PLD of claim 1, wherein:
for each of the first set of at least some of the signal routing lines, the input driver configured to drive from the interface region along the partial signal routing lines for that signal routing line is characterized by a size that corresponds to a distance from the interface driver to the driver on the signal routing line closest to the interface region along the signal routing line.

3. The PLD of claim 1, wherein:
for a second set of signal routing lines, each signal routing line in the second set having the same N associated therewith and having a partial signal routing line formed from the interface region along that signal routing line,
the drivers along each signal routing line of the set are staggered with respect to the drivers along an adjacent signal routing line of the set.

4. The PLD of claim 3, wherein:
the interface region includes signal lines provided from outside the LE array; and
the signal lines provided from outside the LE array are coupled to at least some of the second set of signal routing lines.

5. The PLD of claim 3, wherein:
the interface region includes signal lines provided from IP core logic inserted into the LE array; and
the signal lines provided from the IP core logic are coupled to at least some of the second set of signal routing lines via signal selection circuitry.

6. A programmable logic device (PLD), comprising:
a plurality of logic elements (LE's) arranged in an array;
a signal routing architecture including a plurality of signal routing lines to route signals among the LE's; and
a plurality of signal drivers along each of the signal routing lines,
wherein,
for each of the signal routing lines,
that signal routing line has an integer N associated with the signal routing line; and
the drivers along that signal routing line are regularly spaced along that signal routing line at an interval of N LE's for that line; and
for each of a first set of at least some of the signal routing lines,
that signal routing line is substantially interrupted by an interface region such that a partial signal routing line is formed for that signal routing line between the interface region and a driver along the signal routing line from the interface region less than N LE's from the interface region.

7. The PLD of claim 6, wherein:
for a second set of signal routing lines, each signal routing line in the second set having the same N associated therewith and having a partial signal routing line formed from the interface region along that signal routing line,
the drivers along each signal routing line of the set are staggered with respect to the drivers along an adjacent signal routing line of the set.

8. The PLD of claim 7, wherein:
the interface region includes signal lines coupled to outside the LE array; and
the signal lines coupled to outside the LE array are coupled to at least some of the second set of signal routing lines.

9. The PLD of claim 7, wherein:
the interface region includes signal lines coupled to IP core logic inserted into the LE array; and
the signal lines coupled to the IP core logic are coupled to at least some of the second set of signal routing lines via signal selection circuitry.

10. A programmable logic device (PLD), comprising:
a plurality of logic elements (LE's) arranged in an array;
a signal routing architecture including a plurality of signal routing lines; and
a plurality of signal drivers along each of the signal routing lines,
wherein,
for each of a set of the signal routing lines,
that signal routing line has an integer N associated with the signal routing line;
the drivers along that signal routing line are regularly spaced along that signal routing line at an interval of N LE's for that line; and
the drivers along each signal routing line of the set are staggered with respect to the drivers along an adjacent signal routing line of the set.

11. The PLD of claim 10, wherein the signal routing lines of the set of signal routing lines are substantially interrupted by an interface region such that a partial signal routing line is formed for each of at least some of the signal routing lines, between the interface region and a driver along that signal routing line from the interface region less than N LE's from the interface region.

12. A method of configuring a design of a programmable logic device (PLD), comprising:
a) configuring the design such that the PLD includes a plurality of logic elements (LE's) arranged in an array;
b) configuring the design such that the PLD includes a signal routing architecture including a plurality of signal routing lines to route signals among the LE's; and
c) configuring the design such that the PLD includes a plurality of signal drivers along each of the signal routing lines,
including,
for each of the signal routing lines,
associating an integer N with the signal routing line; and
configuring the design such that the drivers of the PLD along that signal routing line are regularly spaced along that signal routing line at an interval of N LE's for that line; and
for each of a first set of at least some of the signal routing lines,
configuring the design such that the signal routing line of the PLD is substantially interrupted by an interface region such that a partial signal routing line is formed for that signal routing line between the interface region and a driver along the signal routing line from the interface region less than N LE's from the interface region; and
configuring the design such that the PLD further comprises an input driver configured to drive from the interface region along the partial signal routing line formed for that signal routing line.

13. The method of claim 12, wherein:
the method includes configuring the design such that, for each of the first set of at least some of the signal routing lines, the input driver configured to drive from the interface region along the partial signal routing lines for that signal routing line is characterized by a size that corresponds to a distance from the interface driver to the driver on the signal routing line closest to the interface region along the signal routing line.

14. The method of claim 12, wherein:
the method includes configuring the design such that, for a second set of signal routing lines, each signal routing line in the second set having the same N associated therewith and having a partial signal routing line formed from the interface region along that signal routing line, and
the method includes configuring the design such that the drivers along each signal routing line of the set are staggered with respect to the drivers along an adjacent signal routing line of the set.

15. The method of claim 14, wherein:
the method includes configuring the design such that the interface region includes signal lines provided from outside the LE array; and
the method includes configuring the design such that the signal lines provided from outside the LE array are coupled to at least some of the second set of signal routing lines.

16. The method of claim 14, wherein:
the method includes configuring the design such that the interface region includes signal lines provided from IP core logic inserted into the LE array; and
the method includes configuring the design such that the signal lines provided from the IP core logic are coupled to at least some of the second set of signal routing lines via signal selection circuitry.

17. A method of configuring a design of a programmable logic device (PLD), comprising:

configuring the design such that the PLD includes a plurality of logic elements (LE's) arranged in an array;

configuring the design such that the PLD includes a signal routing architecture including a plurality of signal routing lines to route signals among the LE's; and a plurality of signal drivers along each of the signal routing lines, wherein, for each of the signal routing lines, that signal routing line has an integer N associated with the signal routing line; and the method includes configuring the design such that the drivers along that signal routing line are regularly spaced along that signal routing line at an interval of N LE's for that line;

for each of a first set of at least some of the signal routing lines, the method includes configuring the design such that that signal routing line is substantially interrupted by an interface region such that a partial signal routing line is formed for that signal routing line between the interface region and a driver along the signal routing line from the interface region less than N LE's from the interface region.

18. The method of claim 17, wherein:

the method includes configuring the design such that, for a second set of signal routing lines, each signal routing line in the second set having the same N associated therewith and having a partial signal routing line formed from the interface region along that signal routing line, the drivers along each signal routing line of the set are staggered with respect to the drivers along an adjacent signal routing line of the set.

19. The method of claim 18, wherein:

the method includes configuring the design such that the interface region includes signal lines coupled to outside the LE array; and the method includes configuring the design such that the signal lines coupled to outside the LE array are coupled to at least some of the second set of signal routing lines.

20. The method of claim 18, wherein:

the method includes configuring the design such that the interface region includes signal lines coupled to IP core logic inserted into the LE array; and the method includes configuring the design such that the signal lines coupled to the IP core are coupled to at least some of the second set of signal routing lines via signal selection circuitry.

21. A method of configuring the design of a programmable logic device (PLD), comprising:

configuring the design such that the PLD includes a plurality of logic elements (LE's) arranged in an array;

configuring the design such that the PLD includes a signal routing architecture including a plurality of signal routing lines; and configuring the design such that a plurality of signal drivers along each of the signal routing lines, wherein, the method includes configuring the design such that, for each of a set of the signal routing lines, that signal routing line has an integer N associated with the signal routing line;

the drivers along that signal routing line are regularly spaced along that signal routing line at an interval of N LE's for that line; and the drivers along each signal routing line of the set are staggered with respect to the drivers along an adjacent signal routing line of the set.

22. The method of claim 21, wherein the method includes configuring the design such that the signal routing lines of the set of signal routing lines are substantially interrupted by an interface region such that a partial signal routing line is formed for each of at least some of the signal routing lines, between the interface region and a driver along that signal routing line from the interface region less than N LE's from the interface region.

* * * * *